(12) United States Patent
Young

(10) Patent No.: US 6,320,379 B1
(45) Date of Patent: *Nov. 20, 2001

(54) NUCLEAR MAGNETIC RESONANCE APPARATUS

(75) Inventor: Ian R. Young, Marlborough (GB)

(73) Assignee: Picker International, Inc., Cleveland, OH (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/966,823

(22) Filed: Nov. 10, 1997

(30) Foreign Application Priority Data

| Nov. 12, 1996 | (GB) | .................................................... 9623664 |
| Mar. 10, 1997 | (GB) | .................................................... 9704883 |

(51) Int. Cl.⁷ ....................................................... G01V 3/00
(52) U.S. Cl. ........................................... 324/309; 600/421
(58) Field of Search ..................................... 324/318, 322, 324/307, 309, 300; 600/421, 422

(56) References Cited

U.S. PATENT DOCUMENTS

| 4,960,109 | | 10/1990 | Lele . | |
| 5,188,111 | | 2/1993 | Yates et al. . | |
| 5,307,816 | | 5/1994 | Hashimoto . | |
| 5,558,092 | * | 9/1996 | Unger et al. | ..................... 128/660.03 |
| 5,590,653 | * | 1/1997 | Aida et al. | ......................... 128/653.2 |

FOREIGN PATENT DOCUMENTS

| 0558029 | 9/1993 | (EP) . |
| 0 627 206 | 12/1994 | (EP) . |
| 9308733 | 5/1993 | (WO) . |

* cited by examiner

*Primary Examiner*—Louis Arana
(74) *Attorney, Agent, or Firm*—Fay, Sharpe, Fagan, Minnich & McKee

(57) ABSTRACT

A probe 1, for use with magnetic resonance imaging apparatus, which is designed to be inserted into and removed from a patient and which comprises a former 2 upon which an r.f. coil 3 is mounted is characterised in that the former also carries at least one transducer or sensor 6–9 by which the targeting of energy relating to an interventional procedure to an area in the vicinity of the transducer may be controlled both as to position and strength.

8 Claims, 1 Drawing Sheet

U.S. Patent
Nov. 20, 2001
US 6,320,379 B1
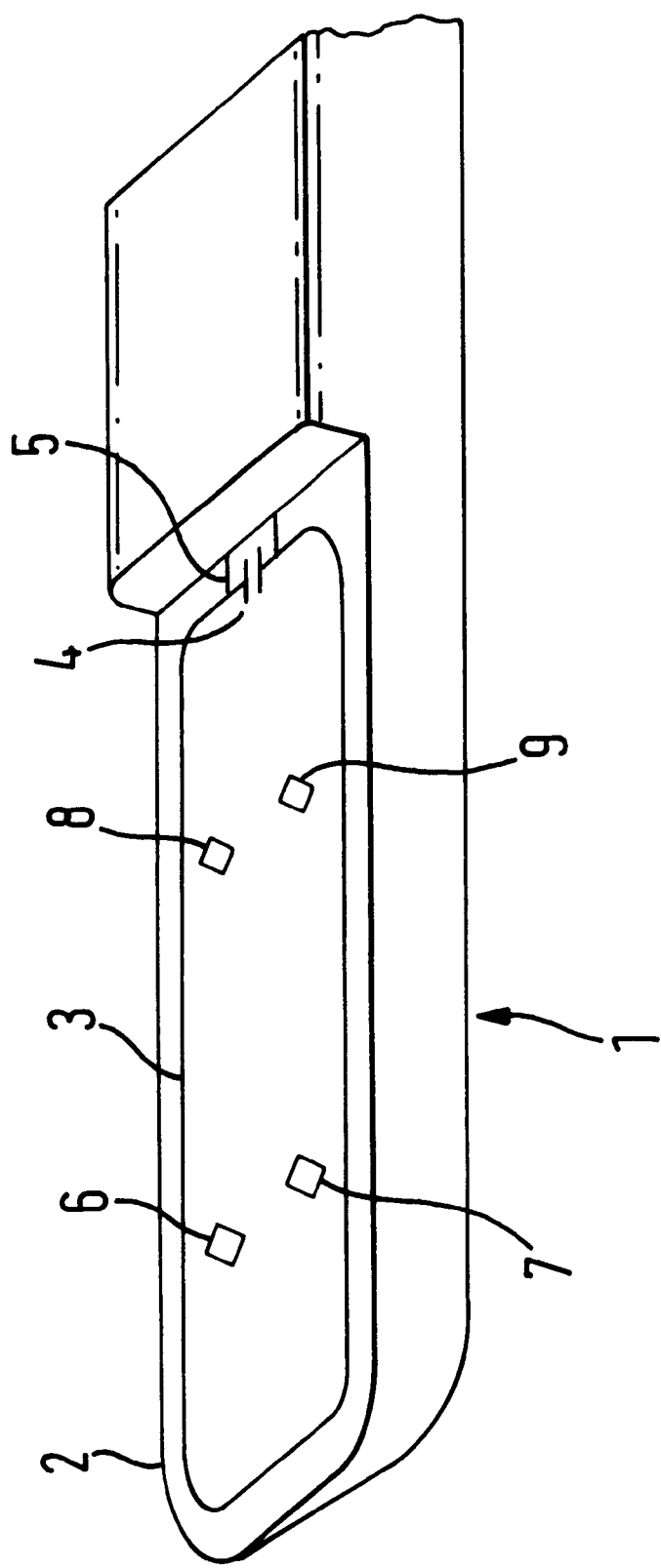

NUCLEAR MAGNETIC RESONANCE APPARATUS

BACKGROUND

This invention relates to nuclear magnetic resonance (NMR) apparatus.

Inserted (or implanted) NMR coils can be sited in many cases close to a lesion which it is proposed to treat by the application of an external therapy remotely targeted at the lesion. Many therapies of interventional magnetic resonance imaging (MRI) are thermal in nature, and involve energies which are intentionally destructive of tissue locally. Such therapies include r.f. hyperthermia, laser ablation and focussed ultrasound. These therapies depend on assumptions about tissue properties in assessing their exact energy profiles, and the location of the focus, or principal region of heat deposition. Because of uncertainties in in vivo temperature measurement, pilot energy depositions are not a satisfactory method of determining energy patterns in human subjects. It is possible to estimate spot location from external data but, short of heating up a region to see where it is, it is difficult to be sure it is where it was intended to be. Reflection, refraction and scattering can affect its location significantly. Heating hot enough to be seen reliably with MRI means that tissue is damaged, so that if there were an error in location, normal tissue might be unintentionally destroyed.

It has been proposed (EP-A-0 558 029) to provide a probe containing an MR coil with temperature and intensity sensors on the outside of a bulb which can be blown up around the probe to rest against the tissue outside. Then the maximum values of the temperature and intensity measured during ultrasonic wave treatment are compared with values calculated for the treatment, with a view to minimising the differences. However, the temperature and intensity sensors will measure the temperature and intensity adjacent them, but this is only indicative of the temperature and intensity at the intended focus of heat deposition, because temperature and intensity gradients are large and variable.

SUMMARY

The present invention provides suitable transducers are located in the body of the inserted or implanted NMR receiver coil which is being used to monitor the therapy, thus alleviating the aforementioned problem.

The invention also provides a probe for use with magnetic resonance imaging apparatus, which is designed to be inserted into and removed from a patient and which comprises a former upon which an r.f. coil is mounted is wherein the former also carries at least one transducer or sensor by which the targeting of energy relating to an interventional procedure to an area in the vicinity of the transducer may be controlled both as to position and strength.

The method suggested here is particularly relevant to r.f. hyperthermia and focussed ultrasound. In both of these the exact distribution of energy inside the relevant tissue is important but hard to determine.

The invention also provides a method of calibrating an externally generated beam of energy to be used in an interventional procedure on a patient, comprising the steps of inserting into the patient a probe comprising a former and an r.f. coil mounted on the former for use with magnetic resonance imaging apparatus, steering the beam at low power to at least one transducer or sensor in the probe, and comparing the actual location of the transducer derived from the magnetic resonance imaging apparatus with the indicated location derived from control apparatus for the externally generated beam of energy.

The targeting of energy in the treatment itself will then be improved.

DRAWINGS

FIG. 1 depicts a probe according to the present invention.

DESCRIPTION

If internal coils (of those for the anus, rectum, etc.) are used to obtain better quality images of internal structures during therapy, the coil formers can be used to locate transducers which can detect the particular radiation at low intensity (well below the level needed to damage tissue). The beams of the energy source can then be steered to target the transducers, which can easily be sensitive enough to avoid any extensible heating of local tissues, and so to establish the beam characteristics of the radiation source near to the target region. The location of the coil in the tissue can be determined from images; if the location of the transducers in the coil former is known, then the shape and size of the beam can be determined as the transducers of the therapy source are adjusted.

Conveniently, more than one transducer can be distributed around the NMR coil to provide a swifter means of detecting beam shape and size if it is not very well localised (as in the case of r.f. hyperthermia) and to help, by providing additional information for triangulation to provide a better measure of the effective location of the beam relative to the transducers. This will assist in working out any movements necessary to adjust the therapy sources to locate on its target accurately. Multiple sensors are advantageous if the coil is large enough (e.g. with a prostate coil monitoring ablation of a prostate, where three is a useful number), allowing greater interrogation of beam profiles, and better discrimination of its behaviour when being steered.

For focussed ultrasound (ultrasonic ablation) PLZT (lead lanthanum zirconate titanate) piezoelectric transducers can be used as they are directly compatible with MR. Multiple dipoles (appropriately tuned coils) can be used for r.f. hyperthermia (looking at the E-field rather than the H-field, though the latter can be monitored also).

A probe for use with magnetic resonance imaging apparatus, and a method using the probe, in accordance with the invention, will now be described, by way of example, with reference to the accompanying figure, which is a perspective view, partly cut away, of the probe.

The probe indicated generally by the reference numeral 1 is suitable for rectal insertion and may be used, for example, for imaging the prostate. The probe consists of a solid former 2 which bears an approximately rectangular r.f. coil 3 which includes a tuning capacitor 4 and leads 5 which connect down the handle of the probe, which is partly cut away, to processing electronics which are not shown.

The probe is used in conjunction with magnetic resonance imaging apparatus not shown, in which a main magnetic field is set up through the patient, and an r.f. pulse is applied through a coil or coils to re-orientate protons aligned with the field. The r.f. pulse may be applied from separate coils or from the coil 3 in the probe 1. The resulting relaxation process in which the protons re-orientate causes a magnetic flux through the coil 3 which produces a current in it which is measured by the processing electronics. The measured signal is spatially encoded by means of gradients in the main magnetic field.

The invention is particularly concerned with applications in which tissue is being treated by the application of an external energy source targeted at the tissue, in order, for example, to destroy diseased tissue. For example, the external energy source could comprise a focussed ultrasound system.

Having identified the diseased region from the MR image, suitable data can be fed into the control system for the externally mounted focussed ultrasound system, in order to generate a size, shape and location of focal spot which corresponds to the region it is intended to destroy thermally. However, it has been found that the actual location of the focal spot will not necessarily be the same as that set into the control system.

In accordance with the invention, the former 2 of the probe 1 carries at least one transducer (in fact, four) 6–9 which can detect the beam of ultrasound.

Thus, the ultrasound system is turned to a low setting at which damage to tissue is not possible, and the beam is steered until the transducer 6–9 (which are connected to the processing electronics via connections in the handle of the probe) indicate that the beam is focussed on the probe. The indicated position of the focal spot as read from the control system for the ultrasound can now be compared with the actual position of the focal spot, as determined from the magnetic resonance image MRI), and appropriate corrections can be made to the control system for the ultrasound image, in order to calibrate the latter.

Then when the treatment takes place, at the operational intensity, the beam will be more accurately directed to the desired area than hitherto.

The transducers may be piezoelectric (for example PLZT transducers). However, the transducers could be replaced by sensors to detect heat, for example, infra-red sensors connected to optical fibres extending down the handle of the probe, which would give a measure of temperature, or temperature transducers such as thermocouples could be used. This would apply whether the treatment was focussed ultrasound, laser ablation, or r.f. hyperthermia.

For laser ablation treatment, an infra-red sensor could be used to sense local necrotisation by reference to local tissue oxygenation. This could be sensed by sensing the relative amounts of haemoglobin and de-oxyhaemoglobin. The latter have absorption edges in the near infra-red which are displaced relative to each other. Multiple wavelengths of infra-red may be transmitted through the tissue to enable the relative quantification of the two. Typically a single detector is used to detect two or three wavelengths transmitted from individual laser light sources alternately.

For r.f. Hyperthermia treatment, dipoles could be used to detect the externally applied field at the probe.

A combination of photo-detectors, piezoelectric sensors and dipoles could be employed.

Fiducial markers (objects such as water containing balls which would show up well on the magnetic resonance image) could be used to improve the accuracy of the location of the coil on the magnetic resonance image. A fiducial marker could be located on the former on the coil axis, and the coil could be modelled around the fiducial on the magnetic resonance image. If the coil is surrounded by tissue giving an RR signal (a cardiac signal) which happens quite a lot, the coil itself will show up on the magnetic resonance image and fiducial markers will not be necessary.

While the illustrated probe is suitable for rectal insertion for imaging the prostate, the invention is not limited to rectal probes, and is applicable to probes to be inserted and removed from other passages in the human or animal body.

What is claimed is:

1. A method of targeting a region of an interior anatomy of a patient for an interventional therapy procedure, the method comprising:

inserting a probe which includes a magnetic resonance coil into a cavity of the patient adjacent the region of interior anatomy that is to be subject to the interventional therapy procedure;

with the probe, generating a magnetic resonance image encompassing the region of interior anatomy and the probe such that the image depicts a location of the probe relative to the region of interior anatomy to be subject to the interventional therapy procedure;

aiming a beam of radiation with a radiation level below a level which damages tissue along a trajectory through the internal anatomy which trajectory intersects the probe;

determining whether the beam of radiation is striking radiation sensors mounted on the probe;

adjusting the trajectory of the radiation beam until the trajectory intersects the sensor such that aiming the radiation beam is correlated with the magnetic resonance image.

2. The method as set forth in claim 1 further including:

aiming the beam of radiation along a trajectory which intersects the region of the internal anatomy to be subject to the interventional therapy procedure;

directing radiation along the beam at an elevated energy which damages tissue in the region.

3. The method as set forth in claim 2 wherein detecting temperature further includes:

sensing infrared energy with the sensors on the probe.

4. The method as set forth in claim 1 wherein the beam of radiation heats the region of the internal anatomy, the method further including:

with a temperature sensor on the probe, measuring an increase in temperature of the internal anatomy adjacent the region.

5. The method as set forth in claim 4 wherein the beam of radiation includes one of ultrasonic radiation, RF radiation, radio frequency energy, laser energy.

6. The method as set forth in claim 1 wherein aiming the trajectory includes:

aiming the radiation beam along a plurality of trajectories which intersect the probe; and, triangulating to correlate the beam trajectory relative to the transducers and the magnetic resonance image.

7. The method as set forth in claim 6 further including:

aiming the radiation beam with a higher energy level along a plurality of trajectories which intersect the region of the interior anatomy targeted for interventional therapy.

8. The method as set forth in claim 1 wherein the step of aiming the radiation beam includes adjusting a focus of the beam to focus the beam on the sensors of the probe.

\* \* \* \* \*